US009997552B2

(12) United States Patent
Inoue et al.

(10) Patent No.: US 9,997,552 B2
(45) Date of Patent: Jun. 12, 2018

(54) SOLID-STATE IMAGING DEVICE, IMAGING APPARATUS, ELECTRONIC APPARATUS, AND SEMICONDUCTOR DEVICE

(71) Applicant: SONY SEMICONDUCTOR SOLUTIONS CORPORATION, Kanagawa (JP)

(72) Inventors: Susumu Inoue, Kanagawa (JP); Kentaro Akiyama, Kanagawa (JP); Junichiro Fujimagari, Kanagawa (JP); Keita Ishikawa, Kanagawa (JP); Jun Ogi, Kanagawa (JP); Yukio Tagawa, Tokyo (JP); Takuya Nakamura, Kanagawa (JP); Satoru Wakiyama, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days. days.

(21) Appl. No.: 15/508,561

(22) PCT Filed: Aug. 28, 2015

(86) PCT No.: PCT/JP2015/074353
§ 371 (c)(1),
(2) Date: Mar. 3, 2017

(87) PCT Pub. No.: WO2016/039173
PCT Pub. Date: Mar. 17, 2016

(65) Prior Publication Data
US 2017/0256577 A1 Sep. 7, 2017

(30) Foreign Application Priority Data
Sep. 11, 2014 (JP) ................. 2014-184857

(51) Int. Cl.
H01L 31/0232 (2014.01)
H01L 27/146 (2006.01)
H04N 5/369 (2011.01)

(52) U.S. Cl.
CPC .. *H01L 27/14618* (2013.01); *H01L 27/14627* (2013.01); *H01L 27/14634* (2013.01); *H01L 27/14636* (2013.01); *H04N 5/369* (2013.01)

(58) Field of Classification Search
CPC ........ H01L 27/14618; H01L 27/14636; H01L 27/14627; H01L 27/14634; H04N 5/369
(Continued)

(56) References Cited

U.S. PATENT DOCUMENTS

2011/0095421 A1* 4/2011 Kim .................... H01L 21/563
257/737
2011/0279717 A1* 11/2011 Wakiyama ........... H01L 21/563
348/294
2014/0185254 A1* 7/2014 Mok .................... H01L 21/563
361/760

FOREIGN PATENT DOCUMENTS

JP 2003-234362 8/2003
JP 2007-150266 A 6/2007
(Continued)

OTHER PUBLICATIONS

International Search Report prepared by the Japan Patent Office dated Oct. 29, 2015, for International Application No. PCT/JP2015/074353.

*Primary Examiner* — Vu A Vu
(74) *Attorney, Agent, or Firm* — Sheridan Ross P.C.

(57) ABSTRACT

The present technology relates to a solid-state imaging device, an imaging apparatus, an electronic apparatus, and a semiconductor device, which can prevent overflow of an underfilling resin filled in a portion adapted to connect the substrate to the flip chip and can prevent secondary damages
(Continued)

such as electric short-circuit and contact with processing equipment. By utilizing a molding technology of forming an on-chip lens, a dam is formed in a ring shape or a square shape in a manner surrounding a range where a flip chip is connected via a solder bump on an upper layer of a substrate of the solid-state imaging device and provided in order to form the on-chip lens. This can block the underfilling resin filled in the range where the substrate and the flip chip are electrically connected. The present technology can be applied to a solid-state imaging device.

12 Claims, 8 Drawing Sheets

(58) Field of Classification Search
USPC .......................................................... 257/432
See application file for complete search history.

(56) References Cited

FOREIGN PATENT DOCUMENTS

| JP | 2010-045082 A | 2/2010 |
| JP | 2011-054794 A | 3/2011 |

* cited by examiner

SOLID-STATE IMAGING DEVICE, IMAGING APPARATUS, ELECTRONIC APPARATUS, AND SEMICONDUCTOR DEVICE

CROSS REFERENCE TO RELATED APPLICATIONS

This application is a national stage application under 35 U.S.C. 371 and claims the benefit of PCT Application No. PCT/JP2015/074353 having an international filing date of 28 Aug. 2015, which designated the United States, which PCT application claimed the benefit of Japanese Patent Application No. 2014-184857 filed 11 Sep. 2014, the disclosures of which are incorporated herein by reference in their entirety.

TECHNICAL FIELD

The present technology relates to a solid-state imaging device, an imaging apparatus, an electronic apparatus, and a semiconductor device, and particularly relates to a solid-state imaging device, an imaging apparatus, an electronic apparatus, and a semiconductor device in which overflow of an underfilling resin filled in a portion adapted to electrically connect a substrate to a flip chip is prevented, and furthermore secondary damages such as electric short-circuit and contact with processing equipment can be prevented.

BACKGROUND ART

As a technique to improve connection reliability at the time of mounting an electrically-connected flip chip on a substrate via a solder bump, adopted is a method in which a resin called an underfilling resin is injected and filled between a substrate and a flip chip and this resin is solidified.

Facing surfaces of the substrate and the flip chip are respectively formed with the solder bumps, and a resin having low viscosity is needed to be selected in order to perfectly fill the underfilling resin in a gap between the substrate and the flip chip including the solder bumps. However, since a slightly larger amount is needed to be injected so as not to be short, some of the underfilling resin may overflow and flow out from a region mounted with the flip chip.

Therefore, in the related art, adopted is a method in which overflow is prevented by: forming a dam for the underfilling resin by providing a solder pattern in a ring shape or a square shape around a region on the substrate where the flip chip is joined; and blocking flow-out of the underfilling resin (refer to Patent Document 1, for example).

CITATION LIST

Patent Document

Patent Document 1: Japanese Patent Application Laid-Open No. 2003-234362

SUMMARY OF THE INVENTION

Problems to be Solved by the Invention

However, since blocking performance for an underfilling resin may be varied by processing shapes of a solder bump and a solder dam, it is necessary to accurately control not only a solder bump shape but also a dam shape.

Additionally, at the time of performing heat processing in a later process, a solder material formed in a ring shape may melt and flow, and the solder may stagnate in a part thereof and overspill, and then may exceed a design width. As a result, not only the blocking performance is deteriorated but also secondary damages caused by electric short-circuit to the chip due to the overspilt solder and contact with chip processing equipment may occur.

The present technology is made in view of the above-described situations, and particularly directed to: preventing overflow of the underfilling resin filled in the portion adapted to connect the substrate to the flip chip by a simple method; and furthermore preventing the secondary damages such as electric short-circuit and contact with the processing equipment.

Solutions to Problems

A solid-state imaging device according to an aspect of the present technology includes: a substrate formed with an on-chip lens and electrically connected to a flip chip; an underfilling resin filled in the electrically-connected range located between the substrate and the flip chip; and a blocking unit formed in a ring shape or a square shape in a manner surrounding the electrically-connected range by molding a material layer of the on-chip lens, and adapted to block the underfilling resin filled in the electrically-connected range.

The blocking unit may be formed by molding the material layer of the on-chip lens so as to have a cross-section formed like a convex lens similar to a shape of the on-chip lens.

Formation may be performed by molding the material layer of the on-chip lens so as to have the cross-section formed like a convex lens similar to the shape of the on-chip lens after the material layer in the electrically-connected range is cut and molded as a dent.

The blocking unit may be formed by molding the material layer of the on-chip lens so as to have a cross-section formed like a concave lens.

The blocking unit may be a groove formed by a technology of molding a penetration hole in the material layer.

The blocking unit may be a groove formed by a technology of molding the penetration hole after the material layer in the electrically-connected range is cut and molded as a dent.

A plurality of blocking units may be formed.

An imaging apparatus according to an aspect of the present technology includes: a substrate formed with an on-chip lens and electrically connected to a flip chip; an underfilling resin filled in the electrically-connected range located between the substrate and the flip chip; and a blocking unit formed in a ring shape or a square shape in a manner surrounding the electrically-connected range by molding a material layer of the on-chip lens, and adapted to block the underfilling resin filled in the electrically-connected range.

An electronic apparatus according to an aspect of the present technology includes: a substrate formed with an on-chip lens and electrically connected to a flip chip; an underfilling resin filled in the electrically-connected range located between the substrate and the flip chip; and a blocking unit formed in a ring shape or a square shape in a manner surrounding the electrically-connected range by molding a material layer of the on-chip lens, and adapted to block the underfilling resin filled in the electrically-connected range.

A semiconductor device according to an aspect of the present technology includes: a substrate including a material layer used for an on-chip lens on a topmost layer and electrically connected to a flip chip; an underfilling resin filled in the electrically-connected range located between the substrate and the flip chip; and a blocking unit formed in a ring shape or a square shape in a manner surrounding the electrically-connected range by molding the material layer used for the on-chip lens, and adapted to block the underfilling resin filled in the electrically-connected range.

According to an aspect of the present technology, a substrate including a material layer used for an on-chip lens on a topmost layer is electrically connected to a flip chip, the electrically-connected range located between the substrate and the flip chip is filled with an underfilling resin, and the underfilling resin filled in the electrically-connected range is blocked by a blocking unit formed in a ring shape or a square shape in a manner surrounding the electrically-connected range by molding a material layer used for the on-chip lens.

Effects of the Invention

According to an aspect of the present technology, overflow of the underfilling resin filled in the portion adapted to connect the substrate to the flip chip can be prevented by a simple method, and furthermore secondary damages such as electric short-circuit and contact with processing equipment can be prevented.

MODE FOR CARRYING OUT THE INVENTION

Solder Dam

Figure 1:
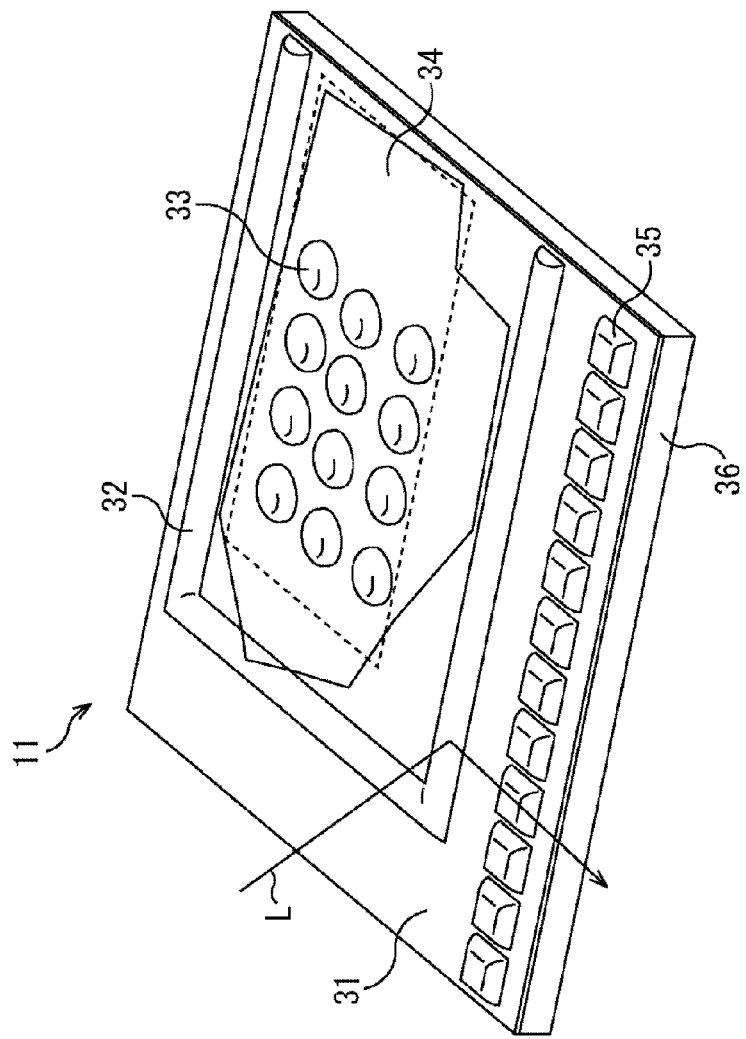
FIG. 1 is a diagram illustrating an exemplary structure of a general solid-state imaging device.
Figure 2:
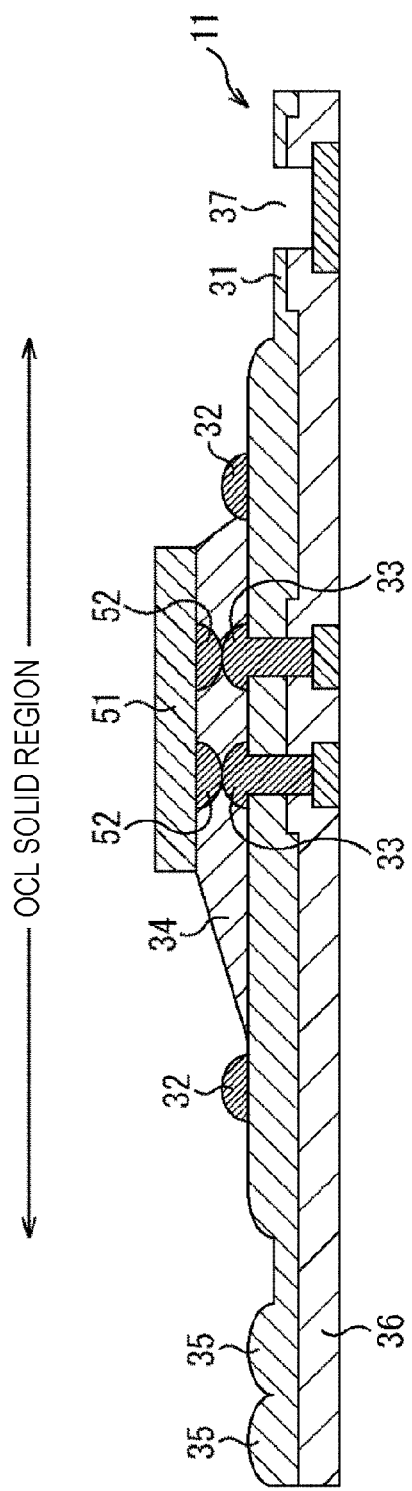
FIG. 2 is a diagram illustrating a side surface cross-section of the solid-state imaging device in FIG. 1.

FIGS. 1 and 2 illustrate exemplary structures of a general solid-state imaging device. Here, FIG. 1 illustrates a layout of components on a substrate constituting the solid-state imaging device, and FIG. 2 illustrates a side surface cross-section when a flip chip is mounted on the substrate in FIG. 1.

A primary material of an on-chip lens (OCL) 35 is provided as a uniform lens material layer 31 entirely on a substrate 11 of the general solid-state imaging device, and the OCL 35 is formed by shaping a surface of the lens material layer 31 into a curved surface shape. An inorganic material layer 36 is formed on an opposite side of a light-incident surface of the lens material layer 31 formed with the OCL 35. The lens material quality layer 31 of the OCL 35 is, for example, STSR, CSiL or the like, and the inorganic material layer 36 is, for example, SiON, SiN, $SiO_2$, or the like.

When light that has entered the above-described structure passes through the OCL 35 and the inorganic material layer 36, light having a predetermined wavelength is extracted and received by a light receiving element not illustrated, and an image signal is formed. Meanwhile, in FIG. 2, an opened portion 37 molded by penetrating the lens material layer 31 and the inorganic material layer 36 is additionally provided in order to form an aluminum pad (Al pad) that is an electrode.

On the lens material layer 31, a range not applied with the molding processing exists as an OCL solid region on the lens material layer 31. A solder bump 33 of the substrate 11 is provided at a position located on the OCL solid region and facing a solder bump 52 provided in a flip chip 51. In other words, the flip chip 51 and the substrate 11 are electrically connected by mutually connecting the solder bumps 33, 52 by soldering.

In order to stabilize an electric connection state at a portion where the solder bumps 33, 52 are connected, an underfilling resin 34 is injected and filled in a portion which is located in a range connected to the flip chip 51 and becomes a gap where the solder bumps 33, 52 are connected, and this underfilling resin is solidified. The underfilling resin 34 is generally formed of an ultraviolet (UV) curing resin, a thermoset resin, and the like. In order to thoroughly fill the underfilling resin 34 in the range where the solder bumps 33, 52 are connected, it is necessary to make viscosity of the underfilling resin 34 low and fill a sufficient amount thereof.

However, since the solder bumps 33, 52 provided in the gap between above the lens material layer 31 on the substrate 11 and the flip chip 51 is disposed in an opened state in a horizontal direction, the underfilling resin may overflow to unnecessary portion at the time of injecting the sufficient amount of the underfilling resin 34 having low viscosity.

Therefore, a solder dam 32 is formed in a ring shape or a square shape in a manner surrounding the range where the solder bumps 33, 52 are connected so as to prevent overflow of the underfilling resin 34. Consequently, even when the sufficient amount of the underfilling resin 34 having the low viscosity is injected to a specific range surrounding the portion where the solder bumps 33, 52 are connected, overflow of the underfilling resin to other ranges can be prevented.

However, in the case of forming the solder dam 32, blocking performance for the underfilling resin 34 is varied by a processing shape such as a height, a width, a pattern shape, a cross-sectional shape, and edge sharpness thereof. Therefore, it is necessary to accurately control not only a solder bump shape but also a dam shape.

Additionally, at the time of performing heat processing in a later process, a solder material formed in a ring shape may melt and flow due to the heat, and the solder may stagnate and overspill, and may exceed a design width, and not only the blocking performance is deteriorated but also secondary damages caused by electric short-circuit of a chip and contact with chip processing equipment may occur.

Furthermore, in the case of application to an imaging element or an optical communication chip, light having entered the imaging element of the substrate may be reflected at a surface of the solder dam and cause flare as illustrated by an arrow L in FIG. 1 because the solder dam is lustrous metal, and adverse effects may be generated.

Moreover, since the substrate 11 and the solder have different linear expansion coefficients, physical stress may be generated at the solder dam portion due to temperature fluctuation, and damages such as crack may be caused.

<First Embodiment>

Accordingly, a solid-state imaging device applying the present technology forms a dam that blocks flow of an underfilling resin 34 by a method similar to a method of forming an OCL 35 by directly molding a lens material layer 31 instead of a solder dam 32 formed on the lens material layer 31.

Figure 3:
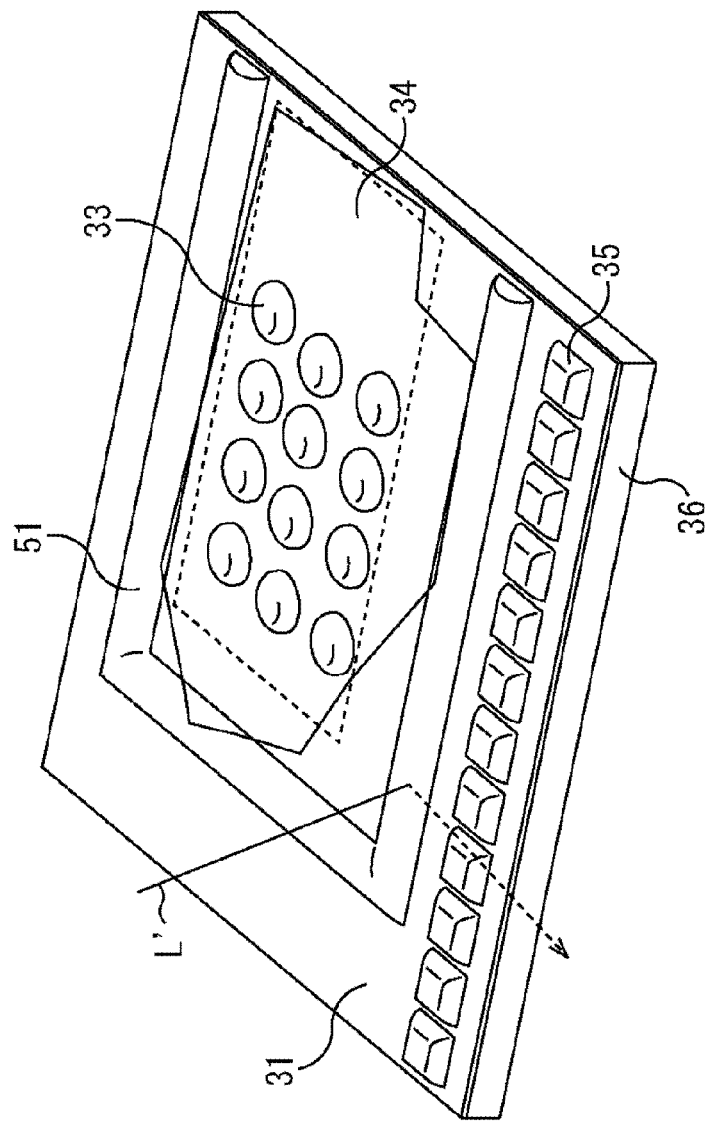
FIG. 3 is a diagram illustrating an exemplary structure of a first embodiment of a solid-state imaging device applying the present technology.
Figure 4:
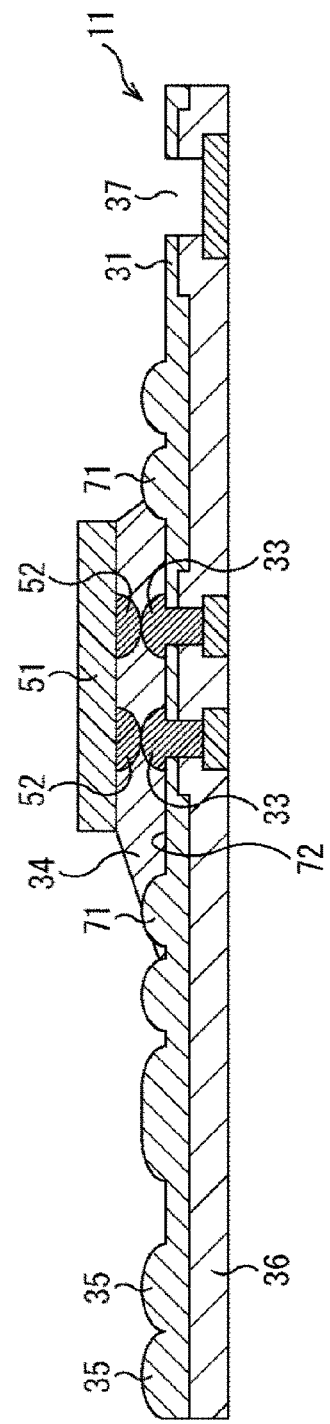
FIG. 4 is a diagram illustrating a side surface cross-section of the solid-state imaging device in FIG. 3.

More specifically, as illustrated in FIGS. 3 and 4, a projecting dam 71 having a shape similar to a lens shape is formed inside an OCL solid region in a ring shape or a square shape in a manner surrounding a region formed with a solder bump 33 instead of the solder dam 32, utilizing a technology of forming the OCL 35. Meanwhile, in FIGS. 3 and 4, note that a component having a same function as that in FIGS. 1 and 2 is denoted by a same name and a same reference sign, and a description therefor will be suitably omitted.

In other words, as illustrated in FIGS. 3 and 4, a dent 72 is formed by cutting the lens material layer 31 in a range that is the OCL solid region and provided with solder bumps 33, 52 in a gap between above the lens material layer 31 on a substrate 11 and a flip chip 51, and additionally, the dam 71 having a height substantially same as the OCL 35 is formed in a ring shape or a square shape in a manner surrounding the same range. This dam 71 can prevent an underfilling resin 34 from overflowing from the range provided with the solder bumps 33, 52 in the gap between above the lens material layer 31 on the substrate 11 and the flip chip 51.

Here, since the lens material layer 31 constituting the dam 71 is generally a thermoset resin and an ultraviolet (UV) curing resin, a shape is not changed by heat processing at the time of solder joining, and it is possible to prevent occurrence of electric processing failure in which the solder melts and short-circuit is caused, for example.

Furthermore, since the lens material layer 31 constituting the dam 71 is the resin not having high reflectance unlike a metal constituting the solder dam 32, an adverse effect such as flare can be prevented as illustrated by an arrow L' in FIG. 3.

Additionally, there may be a damage caused by a difference of a linear expansion coefficient in the solder dam 32, but since the dam 71 has material quality same as the lens material layer 31, the damage caused by heat is suppressed because the linear expansion coefficients are basically the same.

Moreover, in the case where the dam 71 utilizing the material quality same as the OCL 35 is formed in a process same as the OCL 35, processing cost is not increased, and even a fine pattern of a several microns size can be easily processed with high accuracy.

As a result, overflow of the underfilling resin filled in a portion adapted to connect the substrate to the flip chip can be prevented by a simple method, and furthermore secondary damages such as electric short-circuit and contact with processing equipment can be prevented. Moreover, occurrence of flare that may occur at the time of using the solder dam can be prevented.

<Second Embodiment>

A description has been provided above for an exemplary structure in which a lens material quality layer 31 is used to form a projecting dam 71 similar to a convex lens shape by a technology similar to a technology of processing an OCL 35 so as to prevent flow-out of an underfilling resin 34, instead of a solder dam 32. However, since the structure is only needed to prevent the underfilling resin 34 from flowing out, molding similar to a concave lens shape is performed, and a range that is an OCL solid region and provided with solder bumps 33, 52 in a gap between above a lens material layer 31 on a substrate 11 and a flip chip 51 is formed in a manner surrounded in a ring shape or a square shape instead of the dam 71, thereby providing a structure so as to prevent flow-out of the underfilling resin 34.

Figure 5:
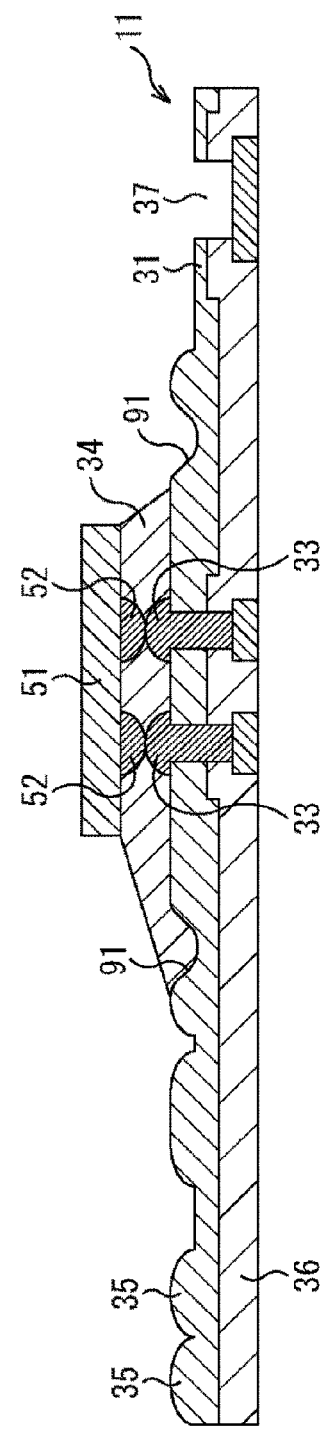
FIG. 5 is a diagram illustrating a side surface cross-section of an exemplary structure according to a second embodiment of a solid-state imaging device applying the present technology.

FIG. 5 illustrates a side surface cross-section of an exemplary structure in which a portion 91 formed of a recessed lens material quality layer 31 similar to a concave lens shape is provided in a ring shape or a square shape in a manner surrounding the range that is the OCL solid region and provided with the solder bumps 33, 52 in the gap between above the lens material layer 31 on the substrate 11 and the flip chip 51.

However, in this example, it is not necessary to form a dent 72 by cutting the lens material layer 31 in the range that is the OCL solid region and provided with the solder bumps 33, 52 in the gap between above the lens material layer 31 on the substrate 11 and the flip chip 51. The reason is that the dent 72 to store the underfilling resin 34 is needed because the underfilling resin 34 is needed to be blocked by the projecting dam 71 in the case of forming the dam 71. However, since the portion 91 has a recessed shape, a separate structure to store the underfilling resin 34 is not needed because this is the shape assuming some flow of the underfilling resin 34.

In this structure also, it is possible to prevent the underfilling resin 34 from overflowing from the range provided with the solder bumps 33, 52 in the gap between above the lens material layer 31 on the substrate 11 and the flip chip 51. More specifically, even in the case of some overflow, such overflow is absorbed into the recessed portion 91. As a result, overflow to other ranges can be prevented.

Furthermore, since the lens material layer 31 constituting the portion 91 is generally a thermoset resin and an ultraviolet (UV) curing resin, a shape is not changed by heat processing at the time of solder joining, and it is possible to prevent occurrence of electric processing failure in which the solder melts and short-circuit is caused, for example.

Moreover, since the lens material layer 31 constituting the portion 91 is the resin not having high reflectance unlike a metal constituting the solder dam 32, occurrence of flare and the like can be prevented.

Furthermore, there may be a damage caused by a difference of a linear expansion coefficient in the solder dam 32, but since the portion 91 has material quality same as the lens material layer 31, the damage caused by heat can be prevented because the linear expansion coefficients are basically the same.

Additionally, in the case where the portion 91 utilizing material quality same as the OCL 35 is formed in a process same as the OCL 35, processing cost is not increased and even a fine pattern having a size of several microns can be easily processed with high accuracy.

Furthermore, in this case, when the dam 71 formed of the above-described projecting lens is additionally formed at an outer periphery thereof, an effect to block the underfilling resin 34 can be more enhanced. In other words, since the recessed portion 91 and the projecting dam 71 are provided, a groove having a projecting shape and a groove having a recessed shape are alternately arranged. Therefore, blocking performance is improved because a volume to store the resin can be increased. Additionally, a plurality of such combinations of the projecting and recessed shapes may be provided.

<Third Embodiment>

A description has been provided above for a structure in which a dam 71 obtained by forming a lens material quality layer 31 in a projecting shape or a recessed portion 91 is provided in a ring shape or a square shape in a manner surrounding a range that is an OCL solid region and provided with solder bumps 33, 52 in a gap between above the lens material layer 31 on a substrate 11 and a flip chip 51. However, as far as a structure that can block flow of an underfilling resin 34 can be provided, other structures may also be applicable. For example, a recessed groove may also be formed in a ring shape or a square shape in a manner surrounding the range by using a technology of making an opening on the substrate 11 in order to provide an electrode pad.

Figure 6:
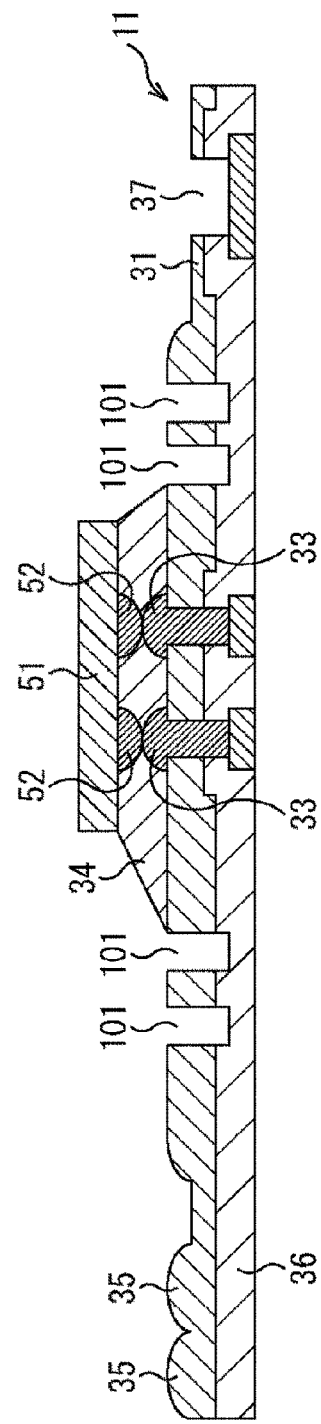
FIG. 6 is a diagram illustrating a side surface cross-section of an exemplary structure according to a third embodiment of a solid-state imaging device applying the present technology.

FIG. 6 illustrates a side surface cross-section of an exemplary structure in which a recessed groove to block flow of the underfilling resin 34 is formed in a ring shape or a square shape in a manner surrounding the range provided with the solder bumps 33, 52 by using the technology of making an opening in order to provide the pad.

In FIG. 6, a recessed groove 101 is provided in a range surrounding, in a ring shape or a square shape, the range that is the OCL solid region and provided with the solder bumps 33, 52 in a gap between above the lens material layer 31 on the substrate 11 and the flip chip 51 by using the technology of making an opening in order to provide the pad.

Therefore, even in the event of overflow of the underfilling resin 34, the underfilling resin can be blocked by the groove 101. More specifically, even in the case of some overflow, such overflow is absorbed into the groove 101. As a result, overflow to other ranges can be prevented.

Meanwhile, a shape of the recessed groove 101 can be optimized by adding an exclusive process. However, in the case of prioritizing cost, part of a pad opening process may be utilized. For example, the groove 101 can be formed while protecting wiring of a substrate chip by only performing a process of a first step to remove the lens material layer 31 among the pad opening process and skipping a second step to remove an inorganic material layer 36.

As a result, effects similar to the solid-state imaging device having the structure described with reference to FIGS. 2 to 5 can be provided in the solid-state imaging device illustrated in FIG. 6 as well.

<Fourth Embodiment>

A description has been provided above for an example in which a recessed groove 101 is formed in a lens material quality layer 31 while leaving an OCL solid region as it is without molding, but a recessed groove may also be formed after forming a dent 72 by cutting a range on a lens material layer 31 and surrounding a range where a flip chip 51 and solder bumps 33, 52 are connected.

Figure 7:
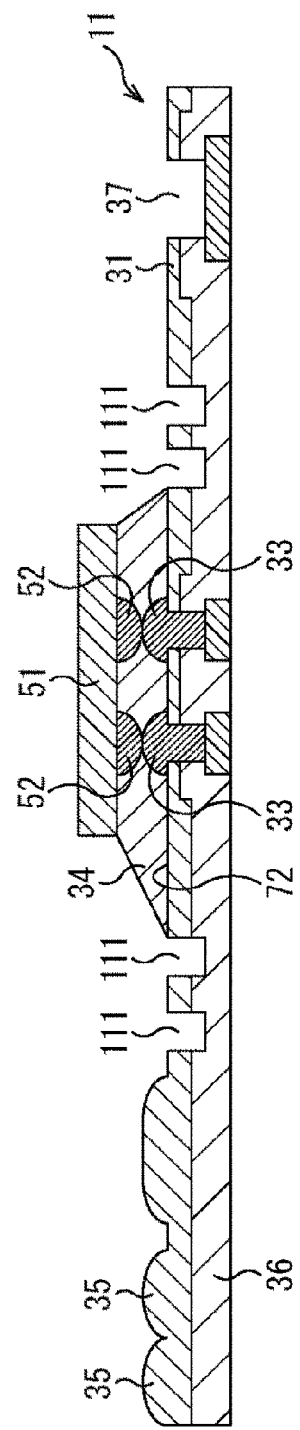
FIG. 7 is a diagram illustrating a side surface cross-section of an exemplary structure according to a fourth embodiment of a solid-state imaging device applying the present technology.

FIG. 7 illustrates an exemplary structure in which a recessed groove 111 is formed after forming the dent 72 by cutting, in a surrounding manner, a range that is the OCL solid region on the lens material layer 31 and used to connect the flip chip 51 to the solder bumps 33, 52.

In other words, in FIG. 7, the recessed groove 111 is formed after forming the dent 72 by cutting, in a surrounding manner, the range that is the OCL solid region and used to connect the flip chip 51 to the solder bumps 33, 52.

In this structure also, effects similar to the case of forming the recessed groove 101 described with reference to FIG. 6 can be provided.

Meanwhile, descriptions have been provided above for the examples in which a dam 71, a portion 91, the groove 101 or 111 is formed by utilizing the lens material layer 31 of the OCL so as to prevent overflow of an underfilling resin 34 at the time of forming a solid-state imaging device, but the similar effects can be provided even in the case of application to a semiconductor device and the like not including a light receiving element and the like, for example. In other words, in the case of a semiconductor device and the like in which a substrate and a flip chip are needed to be connected, overflow of the underfilling resin 34 may also be prevented by forming a lens material quality layer 31 not constantly needed and forming the dam 71, portion 91, groove 101 or 111 by utilizing the lens material layer 31.

Also, a plurality of structures of the dam 71, portion 91, groove 101 or 111 utilizing the above-described lens material layer 31 of the OCL may be provided respectively, and also the plurality of structures may also be combined. Consequently, overflow of the underfilling resin can be prevented more effectively.

Additionally, in FIGS. 6 and 7, examples in which bottom portions of the grooves 101, 111 penetrate the lens material layer 31 and reach the inorganic material layer 36 are illustrated, but a depth is only required to be able to absorb the overflowed underfilling resin 34 and does not have to reach the inorganic material layer 36. In other words, as far as the overflowed underfilling resin 34 can be absorbed, the bottoms of the grooves 101, 111 may have at a depth so as to be formed inside the lens material layer 31, for example.

<Exemplary Application to Electronic Apparatus>

A solid-state imaging device described above is applicable to an imaging apparatus such as a digital still camera and a digital video camera, a mobile phone having an imaging function, or various kinds of electronic apparatuses such as other apparatuses each including an imaging function.

Figure 8:
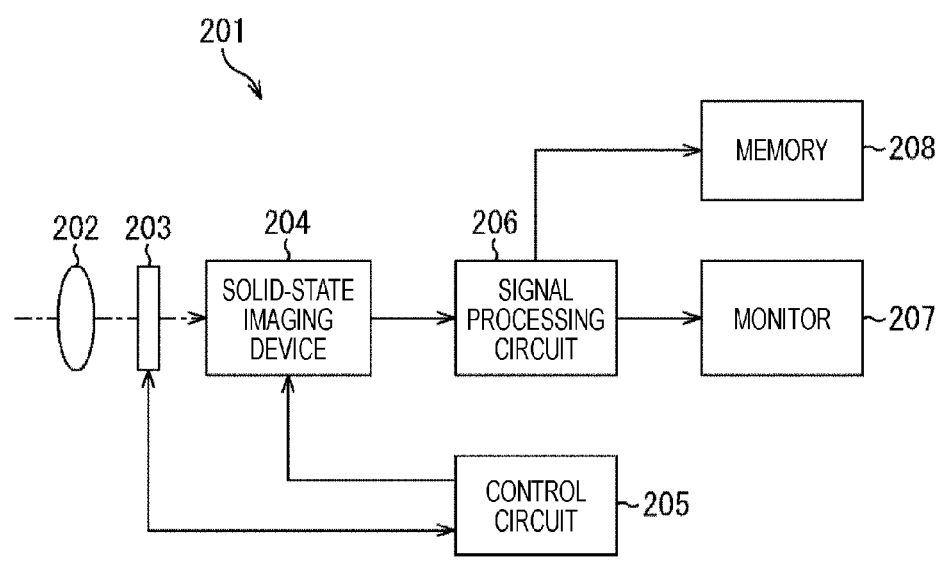
FIG. 8 is a diagram illustrating an exemplary configuration of an electronic apparatus functioning as an imaging apparatus mounted with a solid-state imaging device applying the present technology.

FIG. 8 is a block diagram illustrating an exemplary configuration of an imaging apparatus as an electronic apparatus applying the present technology.

An imaging apparatus 201 illustrated in FIG. 8 includes an optical system 202, a shutter device 203, a solid-state imaging device 204, a drive circuit 205, a signal processing circuit 206, a monitor 207, and a memory 208, and can image a still image and a moving image.

The optical system 202 is formed of one or a plurality of lenses, and guides light (incident light) from an object to the solid-state imaging device 204, and forms an image on a light receiving surface of the solid-state imaging device 204.

The shutter device 203 is disposed between the optical system 202 and the solid-state imaging device 204, and controls a light emitting period and a light shielding period relative to the solid-state imaging device 204 in accordance with control of the drive circuit 205.

The solid-state imaging device 204 is formed of a solid-state imaging device described above. The solid-state imaging device 204 accumulates signal charge for a predetermined period in accordance with the light of which an image is formed on the light receiving surface via the optical system 202 and the shutter device 203. The signal charge accumulated in the solid-state imaging device 204 is transferred in accordance with a drive signal (timing signal) supplied from the drive circuit 205. The solid-state imaging device 204 may be formed in a single body as one chip, and may also be formed as a part of a camera module packaged with the optical system 202, the signal processing circuit 206, or the like.

The drive circuit 205 outputs a drive signal to control transfer operation of the solid-state imaging device 204 and shutter operation of the shutter device 203, and drives the solid-state imaging device 204 and the shutter device 203.

The signal processing circuit 206 applies various kinds of signal processing to signal charge output from the solid-state imaging device 204. An image (image data) obtained from the signal processing applied by the signal processing circuit 206 is supplied and displayed on the monitor 207, or supplied and stored (recorded) in the memory 208.

In the imaging apparatus 201 thus configured, image quality can be improved by applying, as the solid-state imaging device 204, the solid-state imaging device in which overflow of the underfilling resin is prevented as described above.

Additionally, the embodiments of the present disclosure are not limited to the above-described embodiments, and various kinds of modifications can be made within a range without departing from a gist of the present disclosure.

Further, the present technology may adopt the following configurations.

(1) An solid-state imaging device including:
a substrate formed with an on-chip lens and electrically connected to a flip chip;
an underfilling resin filled in the electrically-connected range located between the substrate and the flip chip; and
a blocking unit formed in a ring shape or a square shape in a manner surrounding the electrically-connected range by molding a material layer of the on-chip lens, and adapted to block the underfilling resin filled in the electrically-connected range.

(2) The solid-state imaging device recited in (1), wherein the blocking unit is formed by molding the material layer of the on-chip lens so as to have a cross-section formed like a convex lens similar to a shape of the on-chip lens.

(3) The solid-state imaging device recited in (1) or (2), wherein formation is performed by molding the material layer of the on-chip lens so as to have the cross-section formed like a convex lens similar to the shape of the on-chip lens after the material layer in the electrically-connected range is cut and molded as a dent.

(4) The solid-state imaging device recited in (1), wherein the blocking unit is formed by molding the material layer of the on-chip lens so as to have a cross-section formed like a concave lens.

(5) The solid-state imaging device recited in (1), wherein the blocking unit is a groove formed by a technology of molding a penetration hole in the material layer.

(6) The solid-state imaging device recited in (1) or (5), wherein the blocking unit is a groove formed by a technology of molding the penetration hole after the material layer in the electrically-connected range is cut and molded as a dent.

(7) The solid-state imaging device recited in any one of (1) to (6), wherein the plurality of blocking units is formed.

(8) An imaging apparatus including:
a substrate formed with an on-chip lens and electrically connected to a flip chip;
an underfilling resin filled in the electrically-connected range located between the substrate and the flip chip; and
a blocking unit formed in a ring shape or a square shape in a manner surrounding the electrically-connected range by molding a material layer of the on-chip lens, and adapted to block the underfilling resin filled in the electrically-connected range.

(9) An electronic apparatus including:
a substrate formed with an on-chip lens and electrically connected to a flip chip;
an underfilling resin filled in the electrically-connected range located between the substrate and the flip chip; and
a blocking unit formed in a ring shape or a square shape in a manner surrounding the electrically-connected range by molding a material layer of the on-chip lens, and adapted to block the underfilling resin filled in the electrically-connected range.

(10) A semiconductor device including:
a substrate including a material layer used for an on-chip lens on a topmost layer and electrically connected to a flip chip;
an underfilling resin filled in the electrically-connected range located between the substrate and the flip chip; and
a blocking unit formed in a ring shape or a square shape in a manner surrounding the electrically-connected range by molding the material layer used for the on-chip lens, and adapted to block the underfilling resin filled in the electrically-connected range.

REFERENCE SIGNS LIST

11 Substrate
31 Lens material quality layer
32 Solder dam
33 Solder bump
34 Underfilling resin
35 On-chip lens (OCL)
36 Inorganic material layer
37 Opened portion
51 Flip chip
52 Solder bump
71 Dam
91 Portion
101, 111 Groove

What is claimed is:

1. A solid-state imaging device comprising:
a substrate formed with an on-chip lens and electrically connected to a flip chip;
an underfilling resin filled in an electrically-connected range located between the substrate and the flip chip; and
a blocking unit formed in a ring shape or a square shape in a manner surrounding the electrically-connected range by molding a material layer of the on-chip lens, and configured to block the underfilling resin filled in the electrically-connected range, wherein the blocking unit is formed by molding the material layer of the on-chip lens so as to have a cross-section formed like a convex lens similar to a shape of the on-chip lens, and wherein formation is performed by molding the material layer of the on-chip lens so as to have the cross-section formed like a convex lens similar to the shape of the on-chip lens after the material layer in the electrically-connected range is cut and molded as a dent.

2. The solid-state imaging device according to claim 1, wherein the blocking unit is a groove formed by a technology of molding the penetration hole after the material layer in the electrically-connected range is cut and molded as a dent.

3. The solid-state imaging device according to claim 1, wherein a plurality of blocking units is formed.

4. An imaging apparatus comprising:
a substrate formed with an on-chip lens and electrically connected to a flip chip;
an underfilling resin filled in an electrically-connected range located between the substrate and the flip chip; and
a blocking unit formed in a ring shape or a square shape in a manner surrounding the electrically-connected range by molding a material layer of the on-chip lens, and configured to block the underfilling resin filled in the electrically-connected range, wherein the blocking unit is formed by molding the material layer of the on-chip lens so as to have a cross-section formed like a convex lens similar to a shape of the on-chip lens, and wherein formation is performed by molding the material layer of the on-chip lens so as to have the cross-section formed like a convex lens similar to the shape of the on-chip lens after the material layer in the electrically-connected range is cut and molded as a dent.

5. The imaging apparatus according to claim 4, wherein the blocking unit is a groove formed by a technology of molding the penetration hole after the material layer in the electrically-connected range is cut and molded as a dent.

6. The imaging apparatus according to claim 4, wherein a plurality of blocking units is formed.

7. An electronic apparatus comprising:
a substrate formed with an on-chip lens and electrically connected to a flip chip;
an underfilling resin filled in an electrically-connected range located between the substrate and the flip chip; and
a blocking unit formed in a ring shape or a square shape in a manner surrounding the electrically-connected range by molding a material layer of the on-chip lens, and configured to block the underfilling resin filled in the electrically-connected range, wherein the blocking unit is formed by molding the material layer of the on-chip lens so as to have a cross-section formed like a convex lens similar to a shape of the on-chip lens, and wherein formation is performed by molding the material layer of the on-chip lens so as to have the cross-section formed like a convex lens similar to the shape of the on-chip lens after the material layer in the electrically-connected range is cut and molded as a dent.

8. The electronic apparatus according to claim 7, wherein the blocking unit is a groove formed by a technology of molding the penetration hole after the material layer in the electrically-connected range is cut and molded as a dent.

9. The electronic apparatus according to claim 7, wherein a plurality of blocking units is formed.

10. A semiconductor device comprising:
a substrate including a material layer used for an on-chip lens on a topmost layer and electrically connected to a flip chip;
an underfilling resin filled in an electrically-connected range located between the substrate and the flip chip; and
a blocking unit formed in a ring shape or a square shape in a manner surrounding the electrically-connected range by molding the material layer used for the on-chip lens, and configured to block the underfilling resin filled in the electrically-connected range, wherein the blocking unit is formed by molding the material layer of the on-chip lens so as to have a cross-section formed like a convex lens similar to a shape of the on-chip lens, and wherein formation is performed by molding the material layer of the on-chip lens so as to have the cross-section formed like a convex lens similar to the shape of the on-chip lens after the material layer in the electrically-connected range is cut and molded as a dent.

11. The semiconductor device according to claim 10, wherein the blocking unit is a groove formed by a technology of molding the penetration hole after the material layer in the electrically-connected range is cut and molded as a dent.

12. The semiconductor device according to claim 10, wherein a plurality of blocking units is formed.

* * * * *